(12) United States Patent
Staser

(10) Patent No.: US 12,002,896 B2
(45) Date of Patent: Jun. 4, 2024

(54) ELECTROCHEMICAL UV SENSOR USING CARBON QUANTUM DOTS

(71) Applicant: Ohio University, Athens, OH (US)

(72) Inventor: John Adams Staser, Athens, OH (US)

(73) Assignee: Ohio University, Athens, OH (US)

( * ) Notice: Subject to any disclaimer, the term of this patent is extended or adjusted under 35 U.S.C. 154(b) by 0 days.

(21) Appl. No.: 16/481,567

(22) PCT Filed: Jan. 30, 2018

(86) PCT No.: PCT/US2018/015916
§ 371 (c)(1),
(2) Date: Jul. 29, 2019

(87) PCT Pub. No.: WO2018/140932
PCT Pub. Date: Aug. 2, 2018

(65) Prior Publication Data
US 2020/0006588 A1    Jan. 2, 2020

Related U.S. Application Data

(60) Provisional application No. 62/540,782, filed on Aug. 3, 2017, provisional application No. 62/451,817, filed on Jan. 30, 2017.

(51) Int. Cl.
*H01L 31/055* (2014.01)
*H01L 31/028* (2006.01)
*H01L 31/0352* (2006.01)
*H02S 50/10* (2014.01)

(52) U.S. Cl.
CPC .......... *H01L 31/055* (2013.01); *H01L 31/028* (2013.01); *H01L 31/035218* (2013.01); *H02S 50/10* (2014.12)

(58) Field of Classification Search
CPC ............................ H01G 9/2045; Y02E 10/542
See application file for complete search history.

(56) References Cited

U.S. PATENT DOCUMENTS

| | | | | |
|---|---|---|---|---|
| 3,628,017 A | * | 12/1971 | Lerner | G01J 1/48 250/372 |
| 4,348,664 A | | 9/1982 | Boschetti et al. | |
| 4,400,451 A | * | 8/1983 | Gordon | H01M 14/005 429/111 |

(Continued)

OTHER PUBLICATIONS

Guo, et al., Scientific Reports, 2014, vol. 4, 7469 (Year: 2014).*

(Continued)

*Primary Examiner* — Sadie White
(74) *Attorney, Agent, or Firm* — Wood Herron & Evans LLP

(57) ABSTRACT

A photoelectrode (12) for use in a photocell (10) comprises a graphene substrate (22) functionalized with carbon quantum dots (CQDs) (20). A photocell (10) comprises a photoelectrode (12), a counter electrode (14), and an electrolyte (26). The electrolyte (26) may be a solid polymer electrolyte. The photocell (10) may be an electrochemical UV sensor. A method for sensing UV radiation comprises quantifying a power density of UV radiation using an electrochemical UV (10) sensor comprising CQDs (20) as a photoactive material. The CQDs (20) may be nitrogen-doped CQDs.

5 Claims, 7 Drawing Sheets

(56) References Cited

U.S. PATENT DOCUMENTS

| | | | |
|---|---|---|---|
| 6,046,402 | A | 4/2000 | More |
| 6,387,844 | B1* | 5/2002 | Fujishima ............ C03C 17/2456 427/430.1 |
| 6,805,788 | B1 | 10/2004 | Gonzalez-Martin et al. |
| 2010/0133110 | A1* | 6/2010 | Nocera ................ H01M 14/005 252/182.1 |
| 2011/0155228 | A1* | 6/2011 | Tung .................... H01L 51/4226 205/183 |
| 2012/0156578 | A1* | 6/2012 | Taniguchi ............. C25B 11/073 429/422 |
| 2013/0032782 | A1 | 2/2013 | Gerasimos et al. |
| 2013/0203203 | A1 | 8/2013 | Uenomachi et al. |
| 2015/0218001 | A1* | 8/2015 | Wang ................... G01N 33/588 424/9.6 |
| 2016/0144348 | A1* | 5/2016 | Son .......................... B01J 23/30 136/254 |
| 2020/0392525 | A1* | 12/2020 | Galan ...................... B82Y 5/00 |

OTHER PUBLICATIONS

Dhar, et al., ACS Applied Materials and Interfaces, 2016, vol. 8, pp. 31822-31831 (Year: 2016).*

Fu, et al., Applied Physics Letters, 2012, vol. 100, 223114 (Year: 2012).*

Kang, et al., Biosensors and Bioelectronics, 2015, vol. 64, pp. 499-504 (Year: 2015).*

Tam, et al., Sensors and Actuators A, 2015, vol. 233, pp. 368-373 (Year: 2015).*

Hmar, et al., Thin Solid Films, 2016, vol. 612, pp. 274-283 (Year: 2016).*

Son, et al., Composites: Part B, 2015, vol. 69, pp. 154-158 (Year: 2015).*

Vigil, et al., Sensors and Actuators A 171 (2011) 87-92 (Year: 2011).*

Liu, et al., Applied Physics Letters 105, 073306 (2014) (Year: 2014).*

Yang, et al., Phys. Chem. Chem. Phys., 2015, 17, 32283-32288 (Year: 2015).*

Supplemental information for Yang, et al., Phys. Chem. Chem. Phys., 2015, 17, 32283-32288 (Year: 2015).*

Lee, et al., Organic Electronics 39 (2016) 250-257 (Year: 2016).*

Tamprasertkun, P. et al. "N-doped reduced graphene oxide aerogel coated on carboxyl-modified carbon fiber paper for high-performance ionic-liquid supercapacitors," Carbon. Jun. 1, 2016. vol. 102.

International Search Report in International Patent Application No. PCT/US18/15916, dated May 14, 2018, 4 pgs.

Wang, Y. et al., "Electrochemical UV Sensor Using Carbon Quantum Dot/Graphene Semiconductor," Journal of the Electrochemical Society. Jan 1, 2018. vol. 165. No. 4.

Written Opinion in International Patent Application No. PCT/US18/15916, dated May 14, 2018, 5 pgs.

Zhang, W. et al. "A Nitrogen-Doped Carbon Dot-Sensitized TiO2 Inverse Opal Film: Preparation, Enhanced Photoelectrochemical and Photocatalytic Performance," Journal of The Electrochemical Society. Jan. 1, 2015. vol. 162. No. 9; pp. 639-640.

Dahlan, A.S. et al., "Photodiode and photocapacitor properties of Au/CdTe/P-Si/Al device," Journal of Alloys and Compounds (2015) 646:1151-1156.

Vashchyshyn, F.O. et al., "Photoprocesses in a Semiconducitng Carbon Photocapacitor with a Double Electrical Layer," Semiconductors (2010) 44(7):835-840.

Miyasaka, T. et al., "The photocapacitor: An efficient self-charging capacitor for direct storage of solar energy," Applied Physics Letters (2004) 85(17):3932-3934.

Paulo, S. et al., "Graphene and Carbon Quantum Dot-Based Materials in Photovoltaic Devices: From Synthesis to Applications, Nanomaterials" (2016) 6(157), 20 pgs.

* cited by examiner

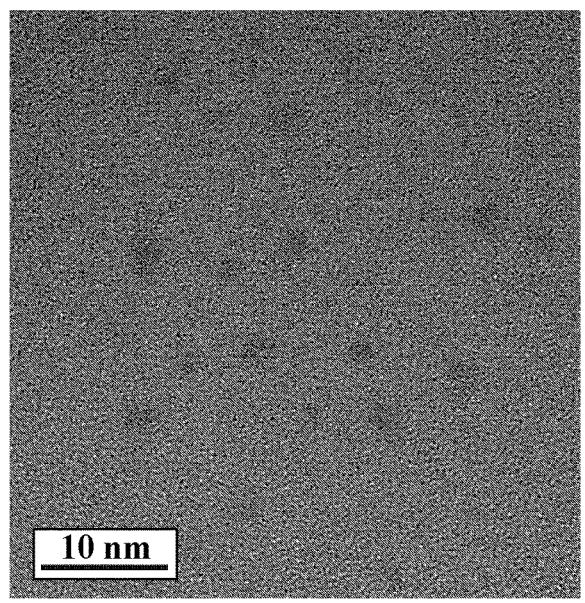 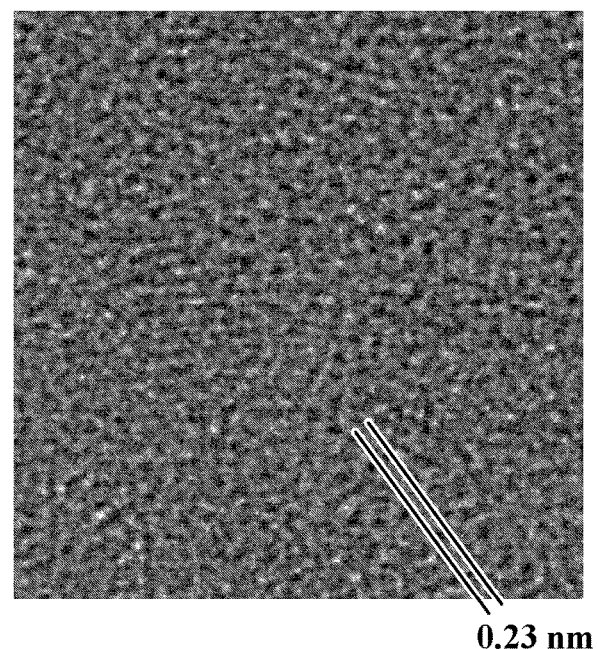
FIG. 7A  FIG. 7B
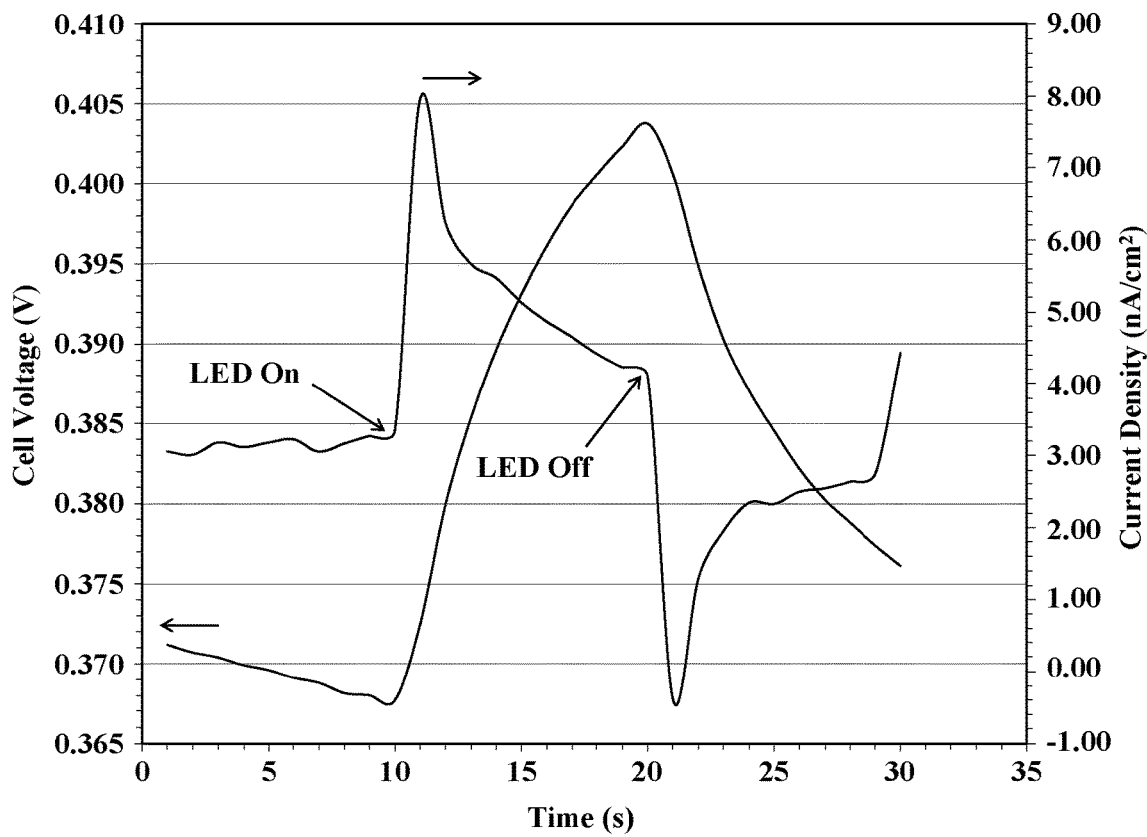
FIG. 8

ELECTROCHEMICAL UV SENSOR USING CARBON QUANTUM DOTS

TECHNICAL FIELD

This invention relates to carbon quantum dots and, more particularly, to an electrochemical ultraviolet (UV) sensor using carbon quantum dots.

BACKGROUND

Exposure to UV radiation via the sun or tanning beds has long been known to cause skin cancer. Skin cancer is a serious public health issue, and one that could be prevented by limiting exposure to tanning beds generally and the sun when possible or by applying sunscreen or taking other preventive measures when limiting exposure to the sun is not possible (i.e., individuals who work outdoors, etc.). Skin cancer is an especially serious public health issue in some areas of the country where both incidence and mortality rates of melanoma, the most dangerous form of skin cancer, are higher than average. Whether prolonged UV exposure is recreational or occupational, understanding the extent of exposure could make individuals more aware of risks to their health and more inclined to either limit exposure or take other protective measures. One way to realize this change in behavior is a wearable device that can detect and quantify exposure to UV radiation over time.

Some mobile device applications exist that claim to monitor exposure to UV radiation, but these applications only monitor the local UV index through weather services and time an individual's exposure. They do not directly measure UV intensity or possess any sensing ability. Wearable UV sensors that directly monitor exposure are preferable, and some companies are developing this technology, although most may not be available to the public yet and accuracy has not been demonstrated. The ones that are available are rather simple color-changing wristbands or focus primarily on the wearer getting more bright light exposure to reduce symptoms of depression without addressing the harmful effects of long-term exposure.

Accordingly, there is a need for a lightweight, inexpensive, wearable sensor with the ability to measure exposure to UV radiation accurately and reproducibly. The sensor could directly impact the public's awareness of UV exposure, potentially influencing public health.

SUMMARY

Embodiments of the present invention are based on carbon quantum dot (CQD) functionalized photoelectrodes and sensors including those photoelectrodes. In an embodiment, a photoelectrochemical UV sensor includes a CQD-functionalized photoelectrode in which the magnitude of current generated upon exposure to UV is related to the radiation intensity. By measuring the photoinduced current over time, the sensor could warn the individual when they are reaching safe UV exposure limits. According to an embodiment, a photoelectrochemical UV sensor is based on nitrogen-functionalized carbon quantum dots (N-CQDs) with a targeted wavelength photoresponse made possible by quantum confinement. UV exposure can be detected and quantified using these nanoscale carbon materials. The UV detection devices are based on nanoscale carbon materials that may be integrated into flexible and transparent substrates capable of supporting wearable designs.

Sensors according to embodiments of the present invention are advantageous in that they include low-cost, environmentally benign materials; produce fast, reproducible, and accurate measurements using established electrochemical techniques; and may be part of lightweight wearable sensors with widespread public adoption for accurate UV detection addressing a continuing public health issue.

The objects and advantages of present will be appreciated in light of the following detailed descriptions and drawings in which:

BRIEF DESCRIPTION OF THE DRAWINGS

FIGS. 7A and 7B are transmission electron microscope (TEM) images of the N-CQDs of FIG. 5.

FIG. 8 is a graph showing the UV radiation-induced response at 80% LED intensity.

DETAILED DESCRIPTION

Figure 1:
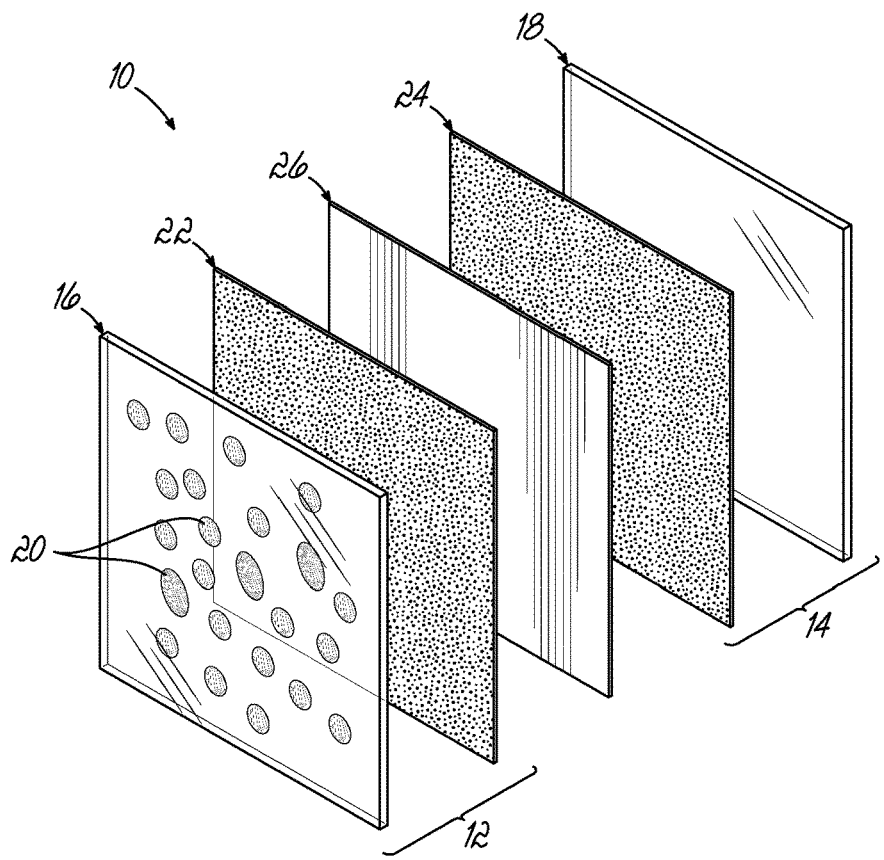
FIG. 1 is an exploded view of an electrochemical UV sensor according to an embodiment of the present invention.

Embodiments of the present invention are directed to a carbon quantum dot (CQD) functionalized photoelectrode and methods of making and using same. Further embodiments of the present invention are directed to a photocell including a CQD-based photoelectrode. A CQD-based photocell acts as a hybrid solar cell and capacitor. In other words, the CQD-based photocell combines solar energy harvesting with energy storage in one device. Additional embodiments of the present invention include an electrochemical ultraviolet (UV) sensor utilizing CQDs as the photoactive material.

CQDs are atomically thin carbon materials that may be synthesized from a carbon source. Nanoscale carbon-based materials, such as carbon quantum dots (CQDs), have size-dependent optical properties, including targeted absorption, photoluminescence, and fluorescence over specific wavelengths due to quantum confinement. Size-dependent properties like the rate of electron excitation can be controlled by tailoring the synthesis technique, which is typically facile. Depending on the particular synthesis procedure and the carbon source, CQDs can be environmentally and biologically benign. Practically any carbon-containing material can be used as the source for CQDs such as, without limitation, carbon-containing material e.g., glucose, starch, tris-acetate-EDTA buffer, orange pericarp, typical laboratory chemicals like citric acid, etc. Further, there are many possible synthesis techniques including, without limitation, hydrothermal methods, electrochemical methods, and even microwave-assisted methods. For example, CQDs may be synthesized using citric acid, ethylene glycol, and water in a microwave-assisted procedure. The resulting CQDs are nontoxic and environmentally benign. CQDs are photoactive and absorb light in the UV, visible, and near IR regions.

The carbon quantum dot synthesis technique may be adjusted to tune CQD size and surface passivation properties. In an embodiment, the CQDs may be polymeric (e.g., polyethylene glycol) passivated CQDs. Controlling the quantum confinement of the CQDs affects the optical and charge transfer properties thereof. For example, controlling the quantum confinement effect typical of atomically thin materials like CQDs may reduce the charge transfer (CT) bandgap and increase electron conduction upon illumination.

In an aspect of the present invention, CQDs may be combined with an electron acceptor to form a photoactive electrode. Illumination of the CQDs by UV radiation excites electrons that can be transported through the CQD matrix to other materials capable of accepting electrons. Thus, in an embodiment, the CQDs are combined with an electron acceptor, such as larger, atomically-thin carbon materials. Suitable electron acceptors include, without limitation, graphene, graphene oxide, a high surface area carbon (e.g., activated carbon, carbon nanotubes, Vulcan XC-72 carbon black, etc.), or other metals or semiconductors (e.g., Si, etc.). Graphene is a two-dimensional zero-gap semiconductor. Graphene possesses unique electronic properties, although by itself graphene is not photoactive. Combining the photoactive CQDs with a semiconducting graphene substrate results in a photoactive electrode based entirely on organic materials, precluding the need for metal or metal oxide current collectors. A graphene or graphene oxide substrate may be made by depositing a layer of graphene or graphene oxide on a substrate such as, for example, carbon paper or other conductive material. The graphene or graphene oxide substrate is then functionalized by depositing the CQDs onto the substrate. The CQD functionalized substrate may act as a photocell photoelectrode.

In an embodiment, a photocell includes a CQD-based photoelectrode, a counter electrode, and an electrolyte. The photocell acts as a hybrid capacitor and solar cell that can store energy for later use without the need for a separate storage device. In other words, a photocell including CQDs and an electron acceptor is capable of harvesting and storing solar energy. The counter electrode may be a high surface area carbon electrode. The electrolyte may be, for example, a solid polymer electrolyte (e.g., a polyethylene oxide based solid polymer electrolyte, Nation® 212, etc.) or an aqueous electrolyte. In an embodiment, a CQD-based photocell may be a flexible, solid-state device. The photocell may have a specific capacitance of 0.1 F/cm$^2$ and/or higher than 0.1 F/cm$^2$ depending on the quantity of CQDs and intensity of the radiation.

CQD-based photocells may be used in a variety of applications including automotive, military, and personal. The significance of such a device for automotive applications is storage of solar energy for on-demand use without the need for separate storage materials, potentially reducing cost and weight and leading to greater solar energy storage efficiencies. As an example, a CQD-based photocell may be used as a UV sensor able to detect stealth equipment (e.g., planes, missiles, etc.) or personnel that reflects or generates a significant amount of UV radiation, which would stand out as a higher intensity than normal background UV. As another example, a CQD-based photocell may be used as a solar sensor to measure exposure to the sun or UV radiation.

In an embodiment, an electrochemical UV sensor includes a CQD-based photoactive electrode, a counter electrode, and an electrolyte. As described above, the CQDs may be combined with an electron acceptor to form a photoactive electrode. The electrochemical UV sensor may be a flexible, wearable sensor. The CQDs serve as the photoactive material that makes response to UV illumination possible. UV illumination induces photovoltage and photocurrent response, with the magnitude of the responses proportional to the radiation intensity. In other words, the time-dependent change in voltage is a function of UV radiation intensity. Thus, the electrochemical UV sensor quantifies the UV radiation intensity.

In an embodiment, an electrochemical UV sensor utilizes nitrogen-doped CQDs (N-CQDs) as the photoactive material. N-CQDs are biologically benign and possess unique properties like electrocatalytic activity and controllable luminescence. N-CQDs have a combination of reproducible photoresponse and high conductivity. The N-CQDs are photoactive over the UV range, and measurable current is induced upon illumination by UV radiation. Doping the CQDs with nitrogen allows for tuning of the optical properties like fluorescence and increase quantum yield and electron transfer. The behavior of the N-CQDs may be tailored to be photoactive only under narrow wavelength ranges (e.g., the UV region, visible region, or IR region depending on CQD size and surface passivation).

The carbon quantum dots in the UV sensor should have: 1) strong absorbance within the UV region; 2) minimal absorbance outside the UV region; and 3) high quantum yields. Regarding absorbance within the UV region, the stronger the absorbance is the higher the resulting photocurrent will be under UV radiation—high photocurrent under UV radiation is indicative of greater material photoactivity. Higher photocurrent may make it possible to more readily quantify the UV radiation intensity by providing larger differences in the magnitude of the photocurrent at different radiation intensities. The UV sensor quantifies the UV radiation intensity based on measurable differences in the photocurrent at different UV radiation intensities. Such measureable differences in the photocurrent are important at lower radiation intensities (e.g., less than 1 mW/cm$^2$) that may represent the intensity of UV radiation incident at the Earth's surface.

Regarding minimal absorbance outside the UV region, the UV sensor should produce minimal photocurrent under radiation at wavelengths outside of the UV region. Significant photocurrent response at wavelengths outside the UV range would interfere with the measurement of UV radiation intensity and lead to erroneous or confusing results. Because UV intensity is influenced by meteorological conditions like cloud cover, the fraction of solar UV radiation reaching the Earth's surface changes. If the UV sensor responds to light over a broad range of wavelengths, it will be difficult or impossible to determine how much UV radiation the user is exposed to. In an embodiment, less than 5% of the photocurrent generated upon illumination by the broad solar spectrum should result from exposure to wavelengths outside the UV region.

The influence of CQD size and surface functionalization, including surface passivation, may be tailored to achieve specific optical performance (photoactivity). N-CQDs may be synthesized with different average particle sizes and surface functionalization. The synthesis procedure influences N-CQD size, which determines quantum confinement effects and the photoresponse at discrete wavelengths. N-CQD size distribution through microwave synthesis is relatively tight, meaning that the majority of the N-CQDs produced lie within a narrow size range. Producing N-CQDs with a narrow size range should promote photoactivity over specific wavelengths due to quantum confinement at the nanoscale. The average diameter of the N-CQDs may range from, for example, 1 nm to 10 nm, 1 nm to 5 nm, 2 nm to 5 nm, 1 nm to 3 nm, or 1 nm to 2 nm. The diameter of the N-CQDs should allow for photoactivity over the desired UV range while taking advantage of quantum confinement excluding excitation of electrons at other wavelengths outside the UV region. Longer microwave synthesis times typically produce smaller N-CQDs. The microwave synthesis time may range from, for example, 3 min to 10 min and may be 7 min Synthesis at higher microwave powers or for longer times will likely lead to smaller particle sizes and enhanced exclusion of absorbance at longer wavelengths outside of the UV region; smaller particle sizes shifts absorption toward the blue. In addition to influencing N-CQD size, varying microwave time may also influence the surface properties of the N-CQDs, including extent of N-doping leading to surface passivation and potential shifts in photoactive wavelength ranges. The ratio of carbon source to surface passivating agent may be in a range of, for example, 5:1 to 1:1. Additionally, higher synthesis temperatures are expected to increase surface passivation and hence absorption ranges with limited recombination. Smaller average particle sizes and greater N-functionalization likely result in maximum photoresponse in the UV range with minimal excited electron/hole recombination, as discussed further below.

Additionally, stability and quantum yield may be tailored to achieve specific optical behavior of the N-CQDs. Average N-CQD size and the extent of surface functionalization influence stability, including a tendency for individual particles to agglomerate. Agglomeration into larger particles likely results in undesirable properties like photoresponse at higher wavelengths due to loss of quantum confinement. Thus, practical applications may involve stable suspensions of the N-CQDs with relatively long shelf lives. Further, quantum yield is essentially the number of times that electrons change energy states per photon absorbed by the N-CQD. Higher quantum yields indicate greater photoactivity. Quantum yield may be determined via UV-vis spectroscopy and fluorescence data. For example, measuring quantum yield may include first determining the wavelength of highest absorbance from the UV-vis spectra for both the standard compound (e.g., quinine sulfate) and the N-CQD solution. The fluorescence for both is then recorded, including the wavelength of highest absorbance in the fluorescence sweep range. The highest emission wavelength is determined from the fluorescence scan. The quantum yield of the N-CQD solution is then determined by the following equation:

$$\varphi_F = \varphi_{F(std)} \frac{F \cdot A_{std} \cdot n^2}{F_{std} \cdot A \cdot n_{std}^2} \quad [\text{Eq. 1}]$$

where $\varphi_F$ is the quantum yield of the N-CQDs, $\varphi_{F(std)}$ is the quantum yield of the quinine sulfate standard, F and $F_{std}$ are the fluorescence areas of the N-CQD and quinine sulfate standard, respectively, A and $A_{std}$ are the absorbance in the N-CQD sample and quinine sulfate standard, respectively, and n and $n_{std}$ are the refractive indices of the two solutions, which can be measured or estimated from similar solutions. In an embodiment, the quantum yield of the N-CQDs may be 5% or greater.

Further, the UV sensor should have a sustained photoresponse with minimal excited electron/hole recombination. Illumination excites an electron in the N-CQD to the conduction band, creating an electron/hole pair. The electron must be transported to the electron acceptor before electron/hole recombination occurs. If recombination occurs before the electron is transported to the electron acceptor, then the photocurrent is lost. Recombination of the exciton reduces short-circuit current, $J_{SC}$, and open circuit voltage, $V_{OC}$. Thus, excited electron/hole recombination could reduce the photocurrent response or could render the UV sensor current unstable. Either result could hinder performance and make UV exposure readings unreliable. Minimizing electron/hole recombination leads to better sustained photocurrent and more accurate measurement of UV radiation intensity. Two parameters likely lead to minimal electron/hole recombination are surface passivation and electron mobility. Surface passivation via addition of polyethyleneamine in the reaction solution, which leads to functionalization with N-containing groups, is expected to reduce recombination, with greater extents of functionalization resulting in lower rates of recombination. However, excessive surface passivation may impose a barrier to electron transport. Thus, while some extent of surface passivation is required to prevent immediate electron/hole recombination, the surface passivation must allow electron diffusion through the N-CQDs that is required for the electron to reach the current collector. Thus, the extent of surface passivation so as to prevent electron/hole recombination should be increased without hindering electron mobility to a great extent. Polarization curves provide information on the rate of electron/hole recombination. The short circuit current density depends on the rate of generation of electron/hole pairs and their respective diffusion lengths. Polarization curves on N-CQDs may be recorded with varying extents of N-doping, as measured by FTIR spectroscopy. Zero N-doping is expected to result in very low short circuit current densities, indicative of rapid electron/hole recombination. Increasing the extent of N-doping should result in higher short circuit current densities, indicating low rates of electron/hole recombination. At a point, further N-doping results in lower short circuit current densities, indicating that the resistance to electron mobility exceeds the recombination mitigation afforded by surface passivation. A typical polarization curve experiment may include first illuminating the UV sensor for a certain period of time at open circuit (no current) conditions to impart a photoinduced voltage to the cell followed by linearly sweeping the voltage to zero (short circuit) under "dark" conditions. The short circuit current density is expected to be a strong function of the both the UV intensity and the photoactivity of the N-CQDs. Photocurrent stability is another indicator of the rate of electron/hole recombination. Higher short circuit current densities measured by polarization curves and stable photocurrent under constant bias potential are indicative of lower rates of excited electron/hole recombination. Thus, in an aspect of the present invention, a combination of control of N-CQD size and extent of N-doping results in minimal photoresponse outside of the UV region and very low rates of electron/hole recombination.

With reference to FIG. 1, an embodiment of the present invention includes a method of making an electrochemical UV sensor 10. The UV sensor 10 is constructed with transparent materials to allow for illumination of the N-CQDs. The photoactive electrode 12 and counter electrode 14 may each include supports 16, 18. For example, a conductive glass slide 16 is coated with a N-CQD solution to form a N-CQD layer 20. A layer of conductive graphene paste 22 (i.e., the electron acceptor) is added on top of the N-CQD layer, forming the photoactive electrode 12. A second glass slide 18 is coated with a layer of graphene 24 only, forming the non-photoactive counter electrode 14. The two electrodes 12, 14 sandwich an electrolyte 26, such as a polymer electrolyte membrane (e.g., Nafion® 212). To help with adhesion of the graphene layers 22, 24 to the electrolyte membrane 26, Nafion® ionomer or a binder (e.g., one similar to the electrolyte) may be added to the graphene solution (not shown). Additionally, some gentle heating (e.g., 50° C.) may also be applied to the electrolyte membrane 26 during application of the graphene layers 22, 24 to assist with adhesion. The two glass slides 16, 18 are clamped together to complete construction.

Figure 2:
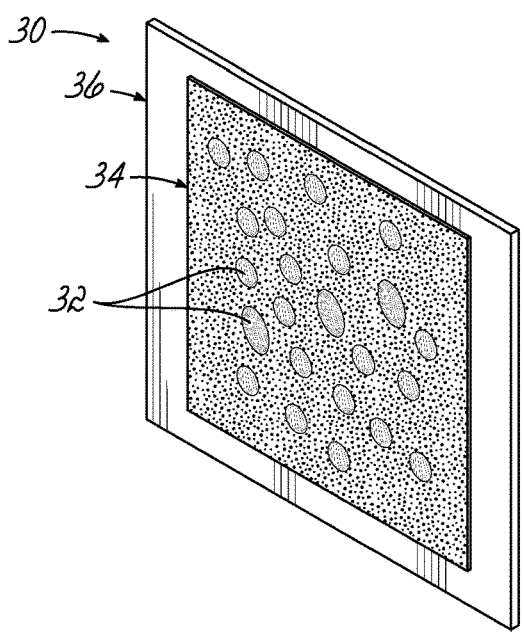
FIG. 2 is a perspective view of an electrochemical UV sensor according to another embodiment of the present invention.

With reference to FIG. 2, in an embodiment, an electrochemical UV sensor 30 includes a photoactive electrode, including N-CQDs 32 and a graphene layer 34, and a counter electrode (not shown). The electrodes are directly applied on the electrolyte membrane 36. Excluding a support (e.g., the glass slides) reduces the weight of the UV sensor 30 and allows for construction of a flexible device.

In use, illuminating the N-CQD side of the UV sensor results in a photoresponse that can be measured by 1) measuring an increase in potential over time under open circuit voltage (OCV, zero current) or 2) measuring the increase in current (the photocurrent) under application of a small, constant bias potential. The small potential (e.g., 0.01 V) is applied to the cell, and the background or "dark" current is measured when the sensor is not exposed to UV radiation. The "dark" current density is typically on the order of 15 $\mu A/cm^2$ and is relatively constant during the initial period over which the UV sensor is not exposed to radiation. Upon exposing the photoactive electrode containing the N-CQDs to UV radiation, the current density increases rapidly. This rapid photocurrent is indicative of excited electrons in the N-CQDs upon illumination transferring to the electron acceptor. No photoresponse is detected by either method if either the N-CQDs or the electron acceptor is absent from the photoactive electrode.

In order to facilitate a more complete understanding of the embodiments of the invention, the following non-limiting examples are provided.

Example 1

A layer of graphene oxide was deposited onto a carbon paper substrate to synthesize the base capacitor. CQDs were deposited onto the graphene oxide substrate to synthesize the photocell electrode. The CQD/graphene oxide photoelectrode (the working electrode) was combined with another graphene oxide electrode (the counter electrode) using a solution of 0.05 M $H_2SO_4$ as the electrolyte. The CQD/graphene oxide photoelectrode was exposed to UV radiation to measure photoinduced current and charge storage ability.

Figure 3:
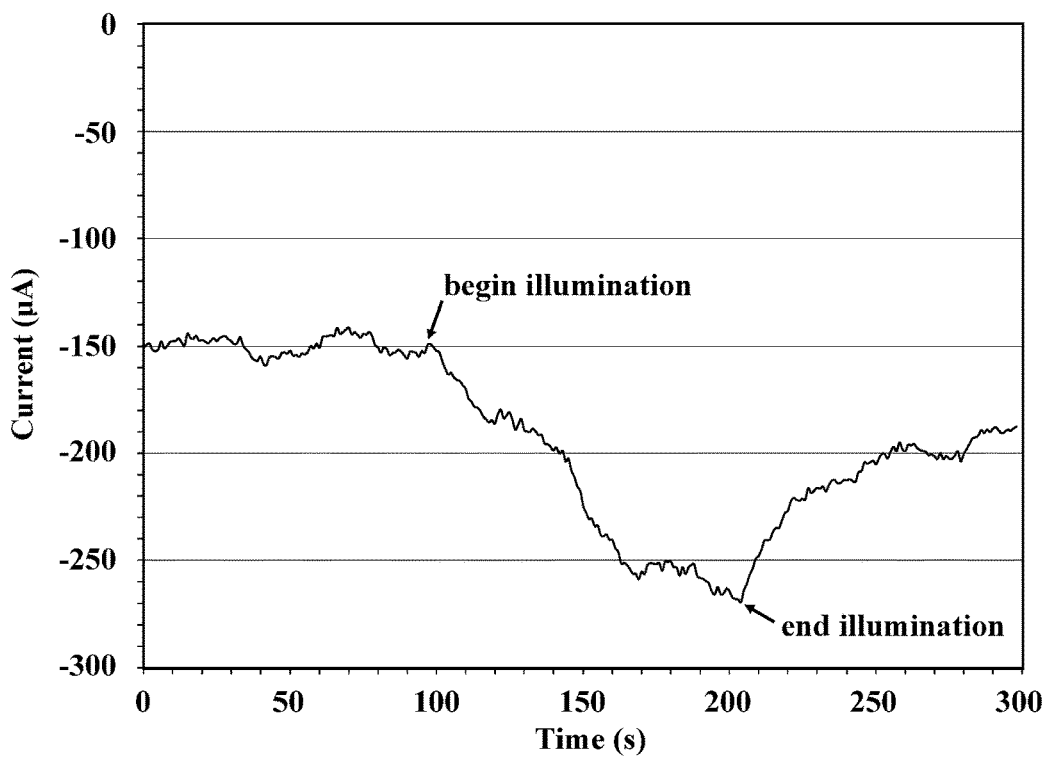
FIG. 3 is a graph of photoinduced current over time of a CQD/graphene oxide photoelectrode according to an embodiment of the present invention under dark conditions, UV illumination, and restored dark conditions.

The photoinduced current under illumination was investigated at short circuit conditions. The photocell was kept in the dark for 100 seconds at open circuit voltage to measure background current and then was illuminated for 100 seconds to measure photoinduced current. After 100 seconds of UV illumination, the dark condition was reinstated to measure the resulting current decay. As shown in FIG. 3, a background current of approximately 150 µA is observed under dark conditions. Upon UV illumination, a photoinduced current approaching 100 µA is observed. This current decays once the photocell electrode is no longer exposed to UV illumination, indicating photoinduced current. Similar behavior is not observed with graphene oxide only electrodes, indicating that CQDs must be present for photocurrent.

Figure 4:
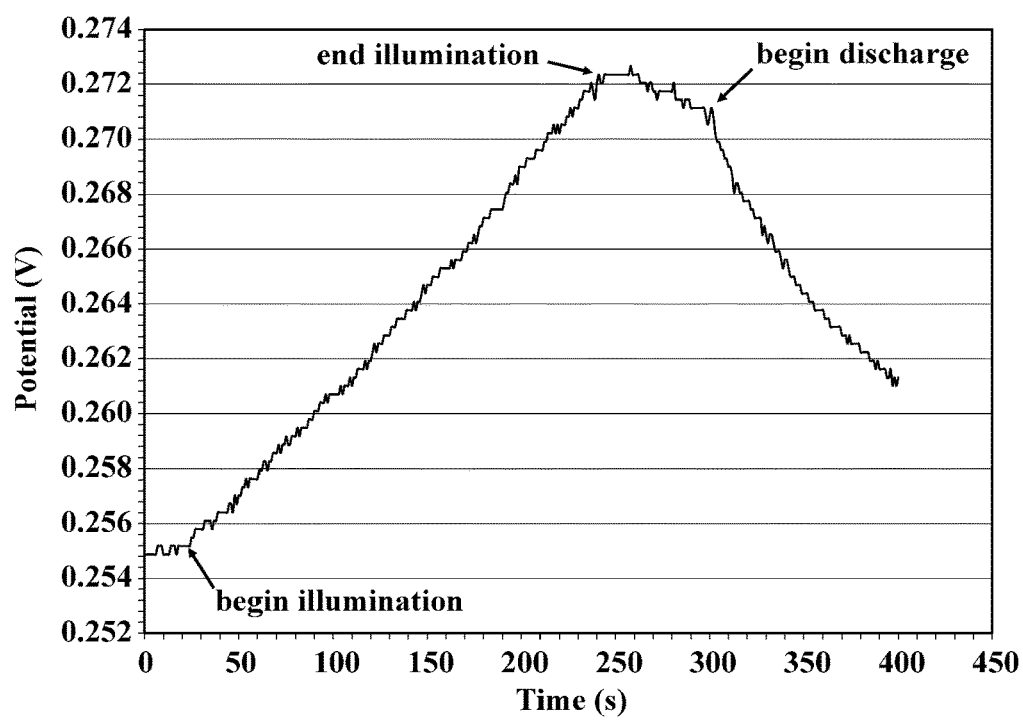
FIG. 4 is a graph showing the charge/discharge curve for the CQD/graphene oxide photoelectrode of FIG. 3.

Next, the ability of the photocell to store charge upon UV illumination was measured. The charging voltage of the device under no applied current (i.e., no induced charging by application of current from an external power supply) was measured. With no applied current, there was no increase in potential that would indicate charging, as expected. The photoelectrode was then exposed to illumination, and a steady increase in potential indicative of charging was observed, as shown in FIG. 4. The device was charged for 150 seconds under UV illumination, at which point illumination was withdrawn to measure the device's capability to store charge (measured as any decrease in potential). A small decrease in potential (self-discharge) was observed over 100 seconds, typical of capacitive devices, after which point the device was discharged at 100 µA. The capacitance of the device upon discharge was 0.035 $F/cm^2$. The small current and voltage measured here are due to untuned quantum confinement effects that reduce efficiency, but the results demonstrate the ability of the nanocarbon material to act as a photocell.

Example 2

An electrochemical UV sensor using N-CQDs as the photoactive material was made. Graphene served as the non-photoactive electrode material, and the electrodes sandwiched a solid, flexible polymer membrane as the electrolyte and separator. A clear photoresponse upon illumination with UV radiation was observed, and the response was proportional to the power density of the UV radiation. The materials, synthesis, characterization, and results are discussed below.

Experimental

Materials

Citric acid and polyethyleneamine were purchased from Sigma-Aldrich and used as received. Conductive graphene paste was purchased from the Graphene Supermarket and used as received. Slide-A-Lyzer Dialysis Cassettes (3000 MWCO) were purchased from Thermo Fisher. Conductive fluorine-doped tin oxide (FTO) glass slides were purchased from Solaronix. Nation® 212 was purchased from the Fuel Cell Store.

N-CQD Synthesis Procedure 1 g of citric acid, 0.35 g of polyethyleneamine, and 50 mL of DI water were added to a glass beaker. The solution was briefly sonicated, and the beaker containing the synthesis solution was added to a home kitchen-grade microwave. The solution was microwaved at 700 W for 7 minutes, at which point a thick dark yellow suspension was obtained. The suspension was diluted with DI water and filtered to remove large particles. The filtered solution containing the N-CQDs was stored at room temperature.

N-CQD Characterization

UV-vis: The Ultraviolet-Visible absorption spectra were obtained using a Hewlet Packard 8452A Diode array spectrophotometer. Each measurement was done by adding 2 mL of N-CQD specimen into a quartz cuvette in the range of 190 nm to 800 nm, with DI water as the blank.

FTIR: Fourier-Transform Infrared spectra for the N-CQDs were obtained using a Bruker Vertex 80 FT-IR spectrometer. To prepare FTIR specimen, a few drops of N-CQD suspension were mixed with certain amount of KBr powder and then dried in the oven at 80° C. for about 1.5 hours. The dried mixture was compressed into a transparent pellet and measured against a blank of pure KBr.

HRTEM: The TEM images of the N-CQDs were recorded on a JEOL JEM-2100F system operating at 200 kV. The specimens were prepared by drop-casting the N-CQDs suspended in DI water onto a 200-mesh copper grid coated with continuous carbon film.

Construction of the UV Sensor

N-CQD solution was added drop-wise to the conductive FTO slide and allowed to dry at slightly elevated temperature (45° C.). Approximately 1 mg of the N-CQDs was added to the glass slide. After addition of the N-CQDs, a layer of conductive graphene paste was added on top of the N-CQDs and allowed to dry at room temperature. Approximately 2 mg of graphene was added to the slide. The N-CQD/graphene slide served as the photoactive electrode.

Conductive graphene paste was added to a second glass slide, which served as the non-photoactive electrode. Nation® 212 was used as the electrolyte between the N-CQD/graphene photoactive electrode and the graphene non-photoactive electrode. The two glass slides were clamped together to complete cell construction. A schematic of the cell is shown in FIG. 1.

UV Detection Using the UV Sensor

Electrochemical response to UV detection was measured using a Solartron Analytical SolarLab XM Photoelectrochemical Test System. The system was equipped with a ThorLabs optical bench with a photodetector. A ThorLabs 365 nm wavelength LED was used as the source of radiation. The UV detector was mounted onto the optical bench so that the N-CQDs were illuminated by the UV radiation. The N-CQD/graphene photoactive electrode served as the working electrode, while the graphene non-photoactive electrode served as the counter and reference electrode.

In the first experiment, the cell was held at open circuit voltage (OCV) conditions, and both the cell voltage and current were measured. The LED was turned off for the first 10 seconds of the experiment, turned on for the next 10 seconds of the experiment, and then turned off again for the final 10 seconds of the experiments. The LED power density, controlled by varying the percent intensity of the LED, was varied between 5.1 mW/cm² and 26.6 mW/cm² (specifically, 5.1 mW/cm², 10.4 mW/cm², 15.7 mW/cm², 21.2 mW/cm², and 26.6 mW/cm²). This power density represented from approximately 20% to 100% LED intensity. The change in cell voltage and current was measured under illumination, with changes upon illumination attributed to a photoresponse from the N-CQDs.

The next experiment consisted of applying a constant potential to the cell and measuring the photocurrent upon illumination. In this experiment, the LED was turned off for the first 10 seconds, turned on for the next 10 seconds at varying power density (the same power densities as those used in the OCV experiment), and then turned off for the final 10 seconds of the experiment. The current was measured during the experiment, with changes under illumination attributed to induction of a photocurrent under UV illumination. This experiment was reproduced three times successfully to determine reproducibility.

The final experiment consisted of varying the photoactive working electrode potential from some predetermined value relative to the counter electrode potential to 0 V vs. the counter electrode potential (essentially short circuit conditions). Specifically, the photoactive working electrode potential was set at 0.1 V relative to the counter electrode under dark conditions, at which point the photoactive electrode was illuminated with 365 nm LED at the same power density range as the previously-described OCV experiment for 10 seconds. Illumination induced a photovoltage, with the magnitude of that photovoltage dependent on the illumination power density. After 10 seconds of inducing a photovoltage, the working electrode potential was swept in the negative direction at 0.02 V/s until short circuit conditions were achieved. Standard I-U curves were obtained from this experiment.

Results and Discussion

N-CQD Characterization

Figure 5:
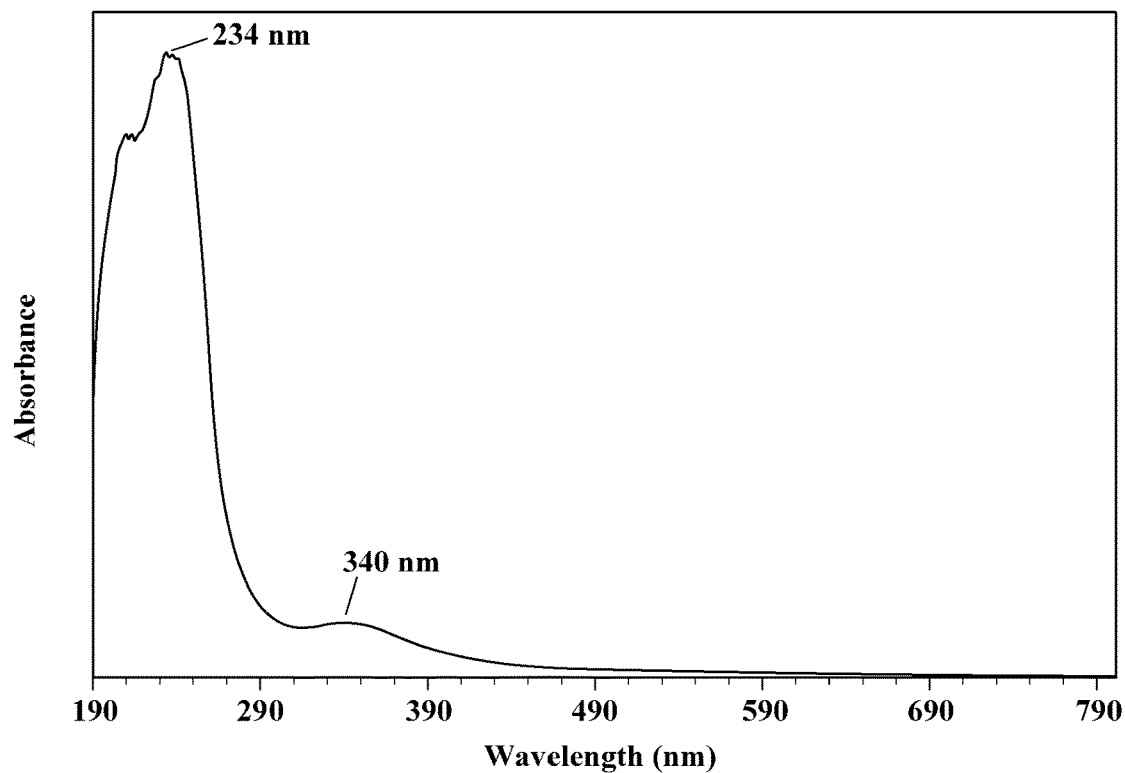
FIG. 5 is a graph showing the UV-vis spectrum of N-CQDs according to an embodiment of the present invention, with an inset showing fluorescence under 365 nm illumination.

UV-Vis: The UV-Vis spectrum (FIG. 5) shows absorption peaks at 234 nm and 340 nm, consistent with previous results of N-CQDs. The former signal corresponds to the $\pi$-$\pi$* transitions of conjugated systems, and the latter signal corresponds to the n-$\pi$* transition of the carbonyl groups. There is little absorbance above 400 nm that might generate a photocurrent and interfere with UV measurement.

Figure 6:
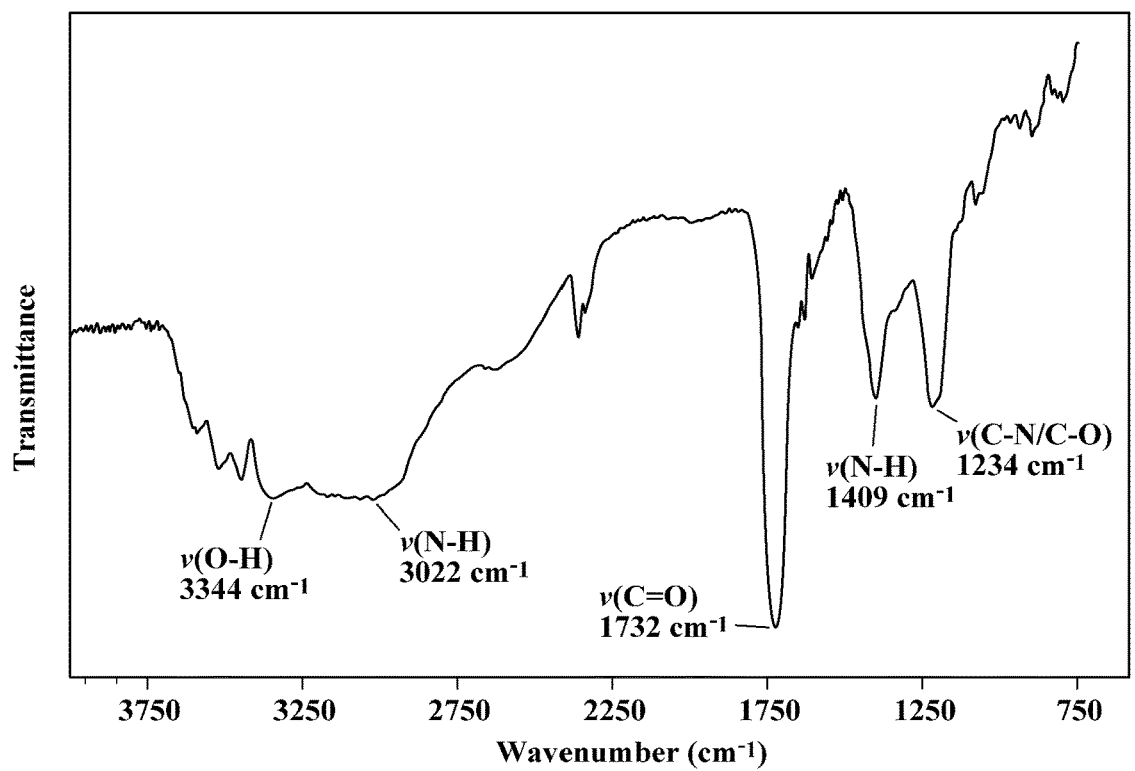
FIG. 6 is a graph showing Fourier-transform infrared spectroscopy (FTIR) spectrum of the N-CQDs of FIG. 5.

FTIR: The obtained FT-IR spectrum (FIG. 6) shows broad, overlapping peaks at 3344 $cm^{-1}$ and 3022 $cm^{-1}$, indicative of the stretching vibrations of N—H and O—H, respectively. The peak at 1732 $cm^{-1}$ is distinctively characteristic of the vibrational stretching of a carbonyl, the peak at 1409 $cm^{-1}$ is indicative of the bending vibrations of N—H, and the peak at 1234 $cm^{-1}$ is result of the stretching vibrations of both C—N and C—O, as indicated by the small shoulder at 1195 $cm^{-1}$.

TEM: FIG. 7A shows a typical TEM image of the N-CQD specimen. The average size of N-CQDs was determined to be 2.2±0.2 nm. The interplanar spacing of N-CQD was measured to be 0.23 nm, as shown in FIG. 7B, which is corresponding to the (11$\bar{2}$0) lattice fringes of graphene.

UV Detection

Typical OCV experiment data are shown in FIG. 8. The LED intensity was set to 80% in this case, or approximately 21.2 mW/cm². The cell voltage is relatively stable over the first 10 seconds of the experiment, during which period the LED is turned off. At the 10 second mark, the LED is turned on and the N-CQD/graphene photoactive electrode is illuminated. At that point, the cell voltage increases rapidly, reaching 0.404 V after 10 seconds of illumination, a total change in cell voltage of 0.037 V during the illumination period. At the 20 second mark, when the LED is turned off again, the cell voltage decreases rapidly. The increase in cell voltage under UV illumination, or the photovoltage, is due to charge transfer induced by illumination of the N-CQDs, and similar behavior is not observed in cells that do not contain the N-CQDs.

Just as illuminating the sensor induces a photovoltage, a photocurrent is observed, also shown in FIG. 8. Upon UV illumination at the 10 second mark, an increase in the cell current density is observed, going from an OCV value of 3.3 nA/cm² to 8.2 nA/cm². Because the experiment is run at OCV conditions, the current decays after an initial peak achieved within the first second of illumination, but some photocurrent is still observed. This photocurrent decays rapidly as soon as the LED is turned off again at the 20 second mark. Because of the nonsteady nature of the photocurrent under OCV conditions (i.e., the potentiostat is controlling for zero current), the initial photocurrent peak (and corresponding maximum voltage increase as a function of time, dU/dt) can be used to quantify LED intensity under these conditions.

Figure 9:
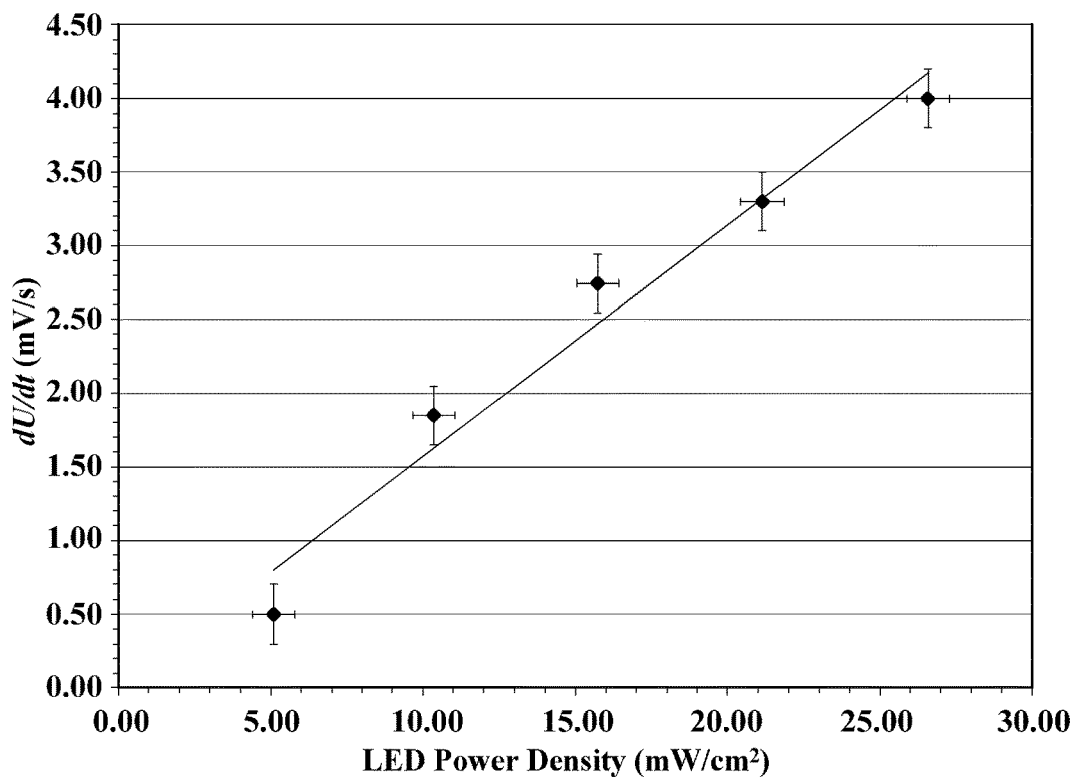
FIG. 9 is a graph showing the rate of photovoltage increase (dU/dt) as a function of LED power density (UV radiation intensity).

FIG. 9 shows the slope of dU/dt under UV illumination at different UV power density. This is essentially the photovoltage change during the initial illumination period at OCV conditions. Error in dU/dt measurement is due to the resolution of the SolarLab XM Photoelectrochemical Test System, and is calculated by the XM-studio PhotoEchem software. There is also some small error in the measured LED power density incident on the electrochemical sensor due to a slight difference in the distance from the LED source to 1) the electrochemical sensor evaluated in this study and 2) the ThorLabs optical bench photodetector. The distance between the LED source and 1) the electrochemical sensor and 2) the optical bench photodetector should be the same for accurate measurement of the LED power density. Any difference in these distances adds error to the measurement of LED power density, which is accounted for in FIG. 9.

As expected, dU/dt increases as the LED power density increases, indicating in general that a larger change in cell voltage (i.e., a greater photovoltage) is induced at higher LED power density. This trend indicates that, as expected, the electrochemical UV sensor can be used to quantify the power density of the illuminating UV radiation by measuring the rate at which the cell voltage changes.

A linear trendline has been fit to the experimental data. The coefficient of determination is high, with $r^2=0.97$ in this case. Also as expected, the intercept of the linear trendline is dU/dt=0 mV/s, indicating that the linear fit predicts zero photovoltage under conditions at which the sensor is not illuminated with UV radiation.

Figure 10:
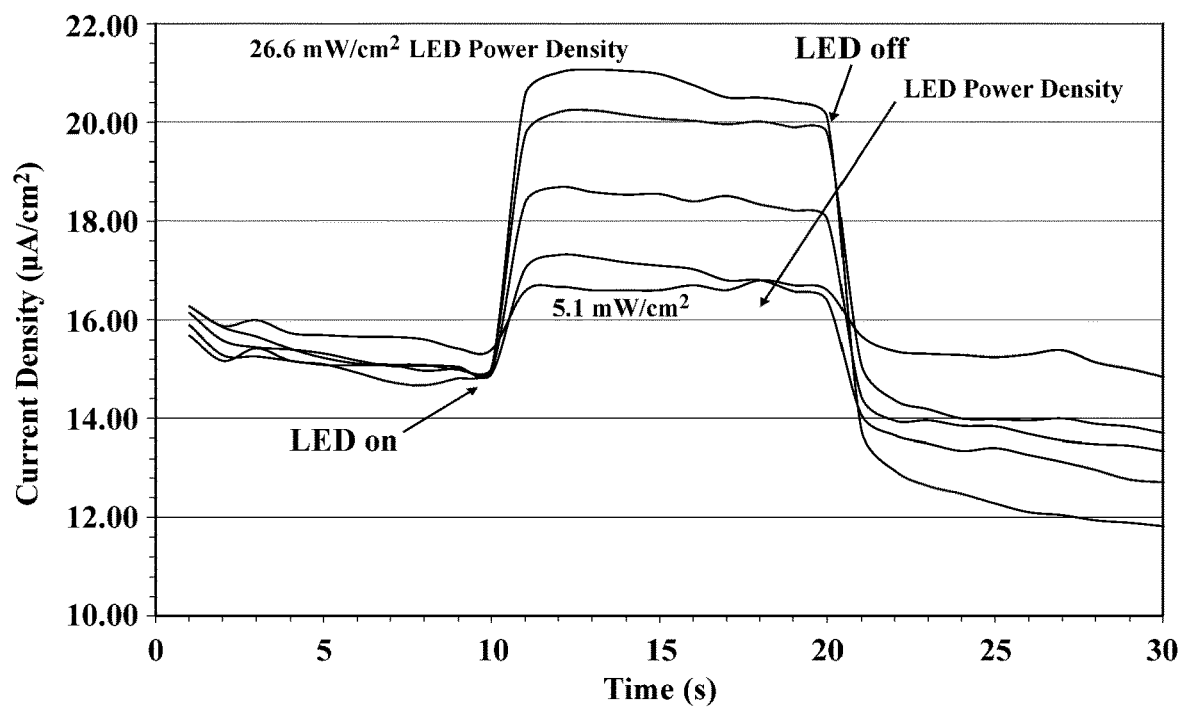
FIG. 10 is a graph showing the photocurrent response under varying levels of LED intensity.

Because of the transient nature of the photoinduced current under OCV conditions, a potential was applied to the cell so that the cell voltage was 0.01 V vs. the short circuit voltage (i.e., 0 V). Under these conditions, a constant current under no LED illumination was observed for the first 10 seconds of the experiment, at which point the LED was turned on at varying power densities. A rapid photocurrent was observed, and this photocurrent was sustained over the 10 second period of LED illumination. After illumination for 10 seconds, the LED was turned off again, at which point the photocurrent decayed rapidly. These data are shown in FIG. 10 and indicate correlation between the LED power density and the magnitude of the photocurrent. For example, the magnitude of the photocurrent at 100% LED intensity (approximately 26.6 mW/cm² power density) was about 5.5 $\mu$A/cm², decreasing to just under 1 $\mu$A/cm² at the lowest LED power density evaluated (5.1 mW/cm²).

Figure 11:
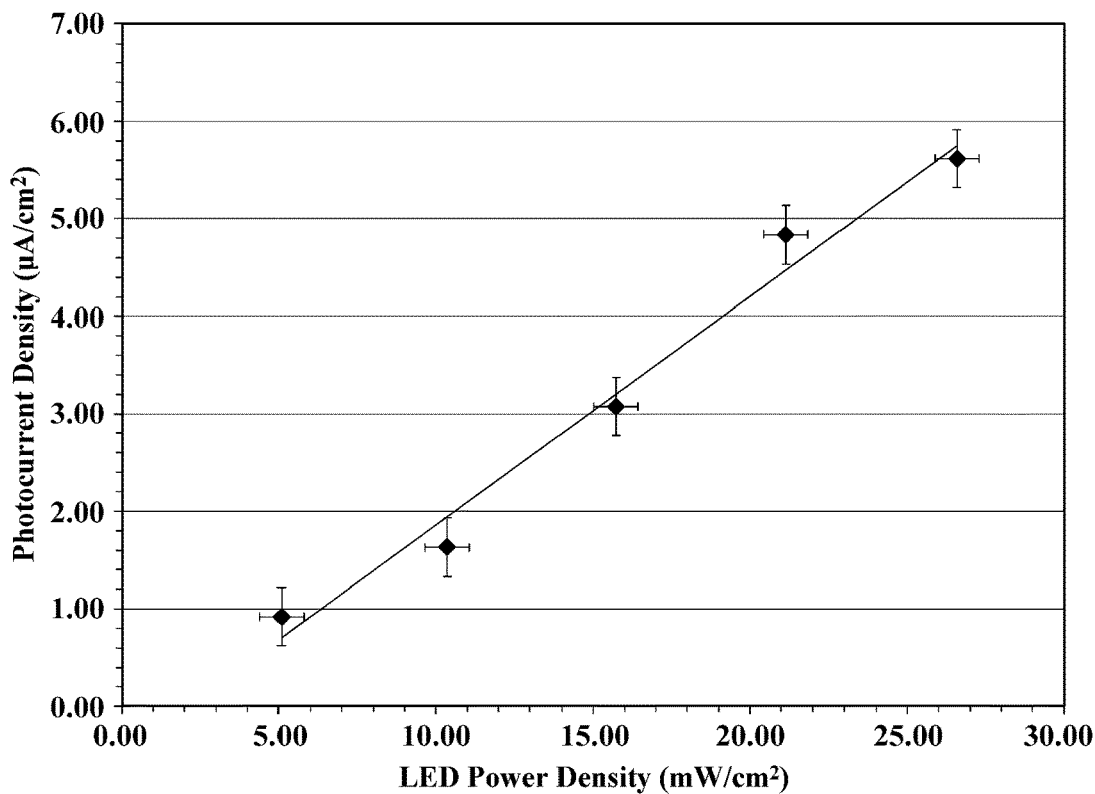
FIG. 11 is a graph showing the magnitude of the photocurrent as a function of LED power density (LED intensity).

Just as when measuring the photovoltage under OCV conditions, the dependence of photocurrent on LED power density is linear, as shown in FIG. 11. The coefficient of determination is likewise high, with $r^2=0.98$, indicating that under applied potential, the electrochemical UV sensor can quantify the radiation intensity. In addition, the photocurrent response is quite rapid, reaching the maximum in less than 1 second.

Figure 12:
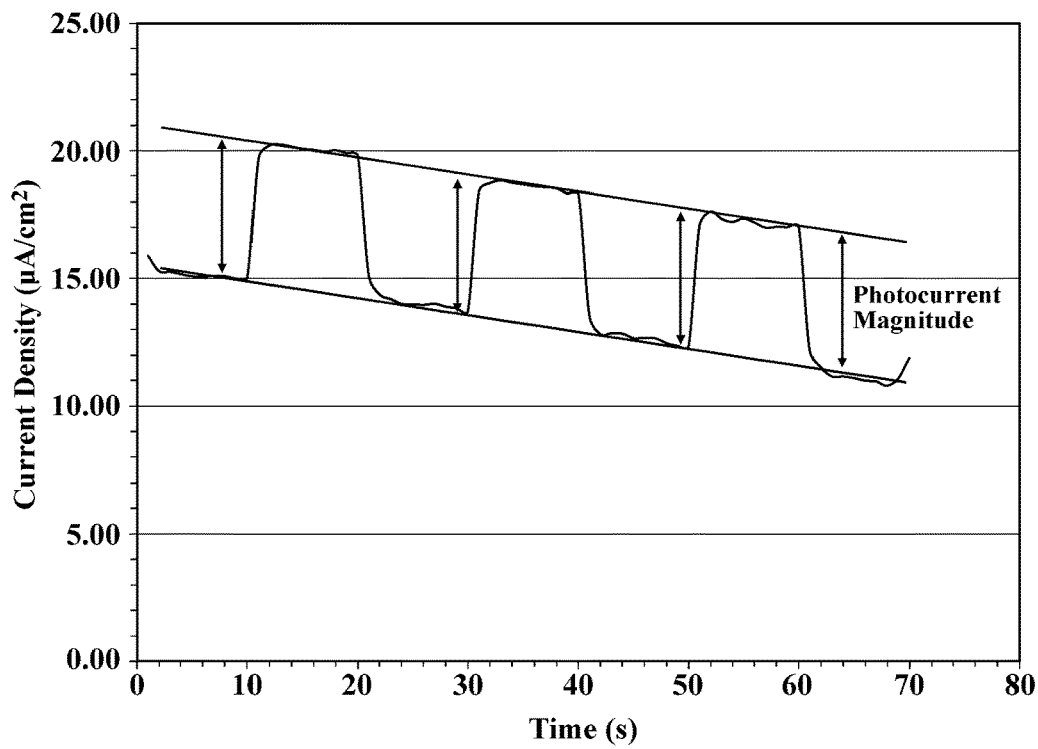
FIG. 12 is a graph showing the current density over time during LED on-off cycles at 80% LED intensity.

To this point, the results show that the electrochemical UV sensor can detect and quantify the intensity of UV radiation under both OCV and applied potential conditions. Reproducibility and stability are key, though, and successive LED on/off cycles are shown in FIG. 12 at 80% LED intensity (approximately 21.2 mW/cm²). One can observe a continuous linear decrease in device current density over time. Instability in the device current density could be due to reduction in the electrolyte conductivity due to dehydration of the Nafion® membrane during the experiment. Despite a linear decrease in device current density over time, the magnitude of the photocurrent does not change over successive cycles. In other words, although device current density decreases during operation, the change in current density upon illumination (i.e., the photocurrent) stays the same, regardless of the device current density with the LED turned off. Thus, over the few successive cycles measured thus far, the photoresponsive current density does not change.

Figure 13:
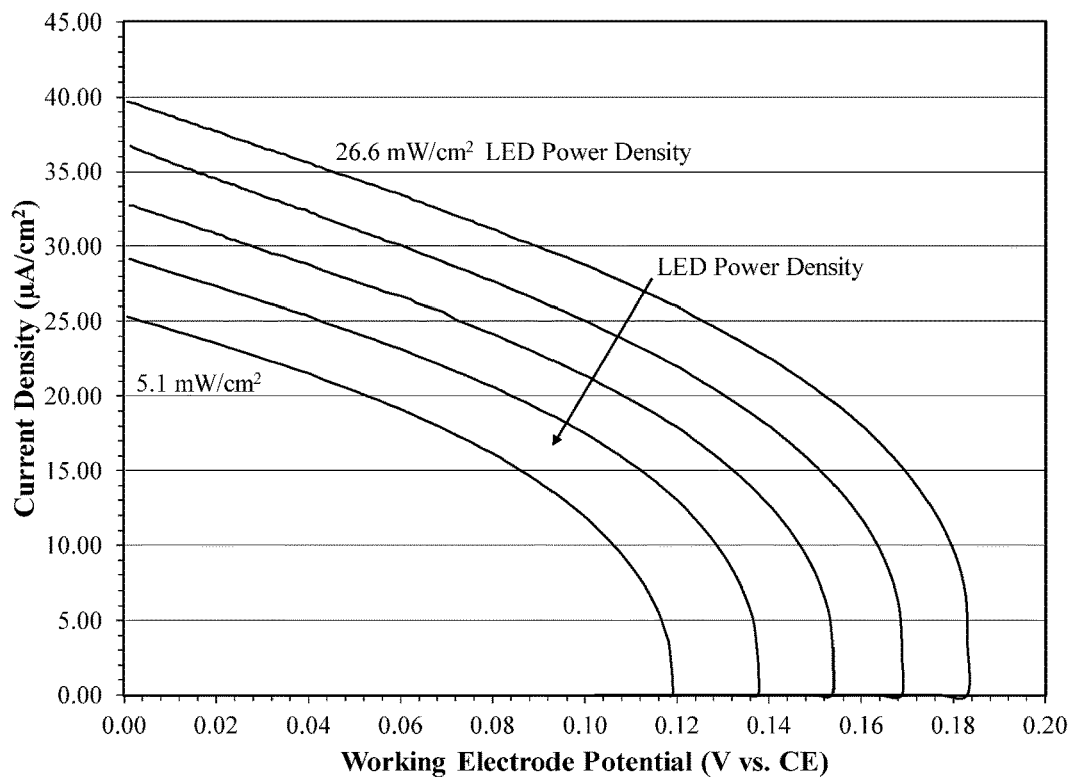
FIG. 13 is a graph showing I-U curves obtained under UV radiation at varying power density.

Finally, it is informative to scan the potential and measure the current response under illumination. I-U curves at different LED power density are shown in FIG. 13. The experiment was run such that the working electrode potential was set to 0.1 V vs. the counter electrode under no LED illumination, at which point OCV conditions were established and the electrochemical sensor was illuminated at varying LED power density for 10 seconds. This illumination induced a photovoltage, increasing the potential of the photoactive electrode; the increase in potential was proportional to the LED power density (same result as the OCV experiments outlined above and presented in FIGS. 8 and 9). The magnitude of the short circuit current density is also a strong function of the LED power density. After 10 seconds of UV illumination at OCV conditions, the working electrode potential was swept in the negative direction at 0.02 V/s until short circuit conditions were achieved.

As expected, the photo-induced potential varies with LED power density. For example, when the N-CQD/graphene photoactive electrode, initially at 0.1 V vs. the non-photoactive counter electrode, is illuminated for 10 seconds by UV radiation at 5.1 mW/cm², the resulting potential is approximately 0.12 V vs. the counter electrode. When the same photoactive electrode, initially at 0.1 V vs. the counter electrode, is illuminated for 10 seconds by UV radiation at 26.6 mW/cm², the resulting potential is approximately 0.184 V vs. the counter electrode. In other words, the photovoltage is a strong function of LED intensity, as already indicated by previously-discussed OCV experiments.

The short-circuit current density, or the maximum current density, is also a strong function of the LED power density, varying from about 25 $\mu$A/cm² at low LED power density to about 40 $\mu$A/cm² at high LED power density. The short circuit current density is quite low relative to typical solar cells due to illumination only at 365 nm and relatively low LED power density. However, the electrochemical UV sensor discussed here should not be thought of as a typical solar cell by which the primary purpose is to generate electricity. In other words, low current density is acceptable in a sensing device like this.

Figure 14:
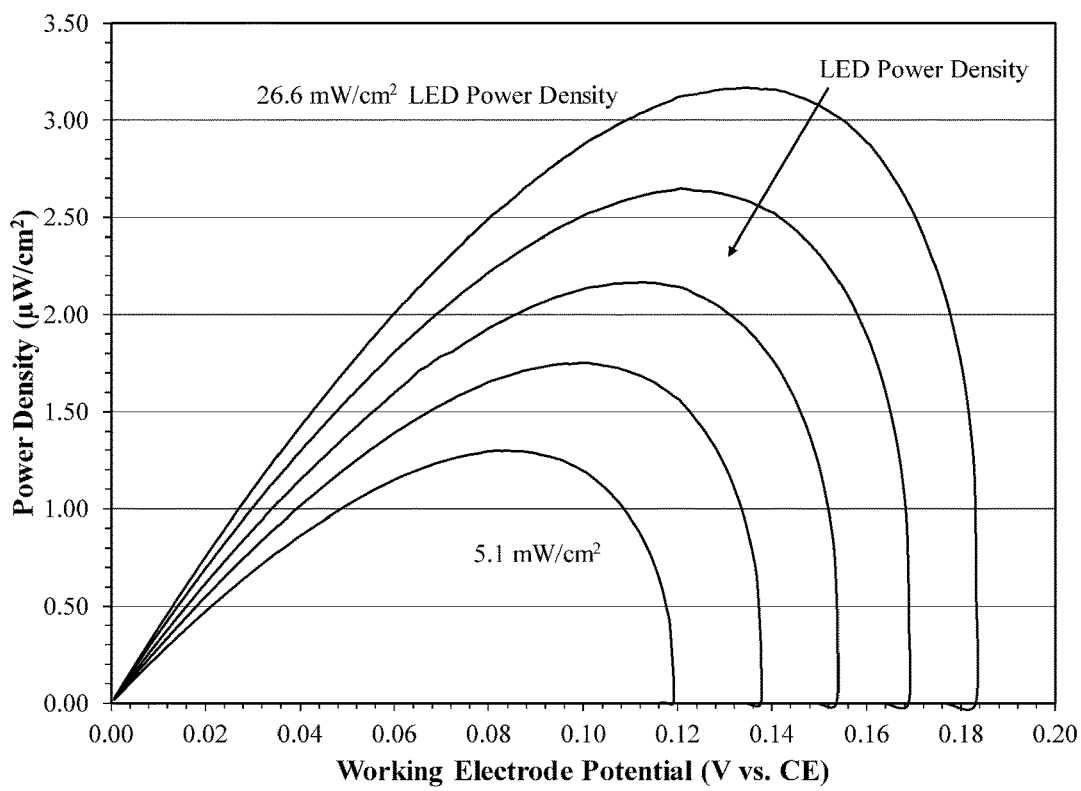
FIG. 14 is a graph showing power density curves under varying levels of UV intensity.

Another way to look at this photoresponse is through the device power density, as shown in FIG. 14. As expected from the data presented thus far, the device power density decreases as the intensity of the UV radiation to which the device is exposed decreases. Again, due to the low current density of the device, the power density is relatively low, likely not suitable for power generation at anything greater than small-scale portable devices. However, as a sensor, these power densities are quite suitable, and indicate again the dependence of device performance on the intensity of the UV radiation.

The stability and reproducibility of the device were determined by several successive LED on/off cycles under an applied potential. Although the device current density decreased over the time of the experiment, 1) the decrease was linear and 2) the magnitude of the photocurrent did not decrease from one cycle to the next. The latter indicates that the photoinduced current is at least reproducible.

While specific embodiments have been described in considerable detail to illustrate the present invention, the description is not intended to restrict or in any way limit the scope of the appended claims to such detail. The various features discussed herein may be used alone or in any combination. Additional advantages and modifications will readily appear to those skilled in the art. The invention in its broader aspects is therefore not limited to the specific details, representative apparatus and methods and illustrative examples shown and described. Accordingly, departures may be made from such details without departing from the scope of the general inventive concept.

What is claimed is:

1. A method for sensing UV radiation comprising:
quantifying a power density of UV radiation using an electrochemical UV sensor comprising a photoelectrode, the photoelectrode consisting of a graphene substrate functionalized with carbon quantum dots (CQDs) as a photoactive material.

2. The method of claim 1, wherein quantifying comprises measuring a rate at which a cell voltage of the electrochemical UV sensor changes.

3. The method of claim 1, wherein the electrochemical UV sensor comprises the photoelectrode including the CQDs, a counter electrode and an electrolyte.

4. The method of claim 3, wherein the electrolyte is a solid, flexible polymer electrolyte.

5. The method of claim 1, wherein the electrochemical UV sensor is flexible.

* * * * *